United States Patent [19]

DeYoung et al.

[11] Patent Number: 5,269,708
[45] Date of Patent: Dec. 14, 1993

[54] PATCH PANEL FOR HIGH SPEED TWISTED PAIR

[75] Inventors: David M. DeYoung, Bloomington; William A. Kinghorn, Minneapolis, both of Minn.

[73] Assignee: ADC Telecommunications, Inc., Minneapolis, Minn.

[21] Appl. No.: 19,008

[22] Filed: Mar. 3, 1993

[51] Int. Cl.⁵ .......................................... H01R 13/00
[52] U.S. Cl. .................................................. 439/676
[58] Field of Search ............... 439/76, 78, 571, 676

[56] References Cited

U.S. PATENT DOCUMENTS 5,132,877  7/1992  Branan et al. ............... 439/676
5,186,647  2/1993  Denkmann et al. .......... 439/676

*Primary Examiner*—Joseph H. McGlynn
*Attorney, Agent, or Firm*—Merchant, Gould, Smith, Edell, Welter & Schmidt

[57] ABSTRACT

A patch panel includes a printed circuit board, an RJ-45 jack and a connector block. The circuit paths from the RJ-45 jack to the connector block are selected to cross in a predetermined crossing pattern with the circuit paths having a predetermined length selected for the patch panel to carry high speed transmissions.

10 Claims, 4 Drawing Sheets

PATCH PANEL FOR HIGH SPEED TWISTED PAIR

BACKGROUND OF THE INVENTION

1. Field of the Invention

This application pertains to patch panel circuits for the telecommunications industry. More particularly, this invention pertains to a patch panel for twisted pair cables carrying data at high speed rates.

2. Description of the Prior Art

In the prior art, patch panels for connecting telecommunications equipment are well known. Furthermore, twisted pair cables have long been used in the telecommunications industry for data at lower rate transmissions.

The telecommunications industry has recently developed standards for high data rate transmission over twisted pair cables. Referred to as Category 5, the standard is found in EIA/TIA Technical Service Bulletin PN-2948 and EIA/TIA 568. The standard contemplates a 100 MHz data transmission carried over 100 ohm unshielded twisted pair cables.

Prior art patch panels which would consist of various jacks and connectors carried on a printed circuit board, cannot meet the specifications of Category 5. It is an object of the present invention to provide a patch panel which will meet the performance specifications of Category 5.

SUMMARY OF THE INVENTION

According to a preferred embodiment of the present invention, a patch panel is provided having an RJ-45 jack carried on a printed circuit board. A connector block is also carried on the printed circuit board. The leads of the jack and leads of the connector block are electrically connected through pairs of circuit paths formed on the printed circuit board. The circuit paths include a crossing geometry which we have found to facilitate transmission of data in conformance with Category 5.

DESCRIPTION OF THE PREFERRED EMBODIMENT

Figure 1:
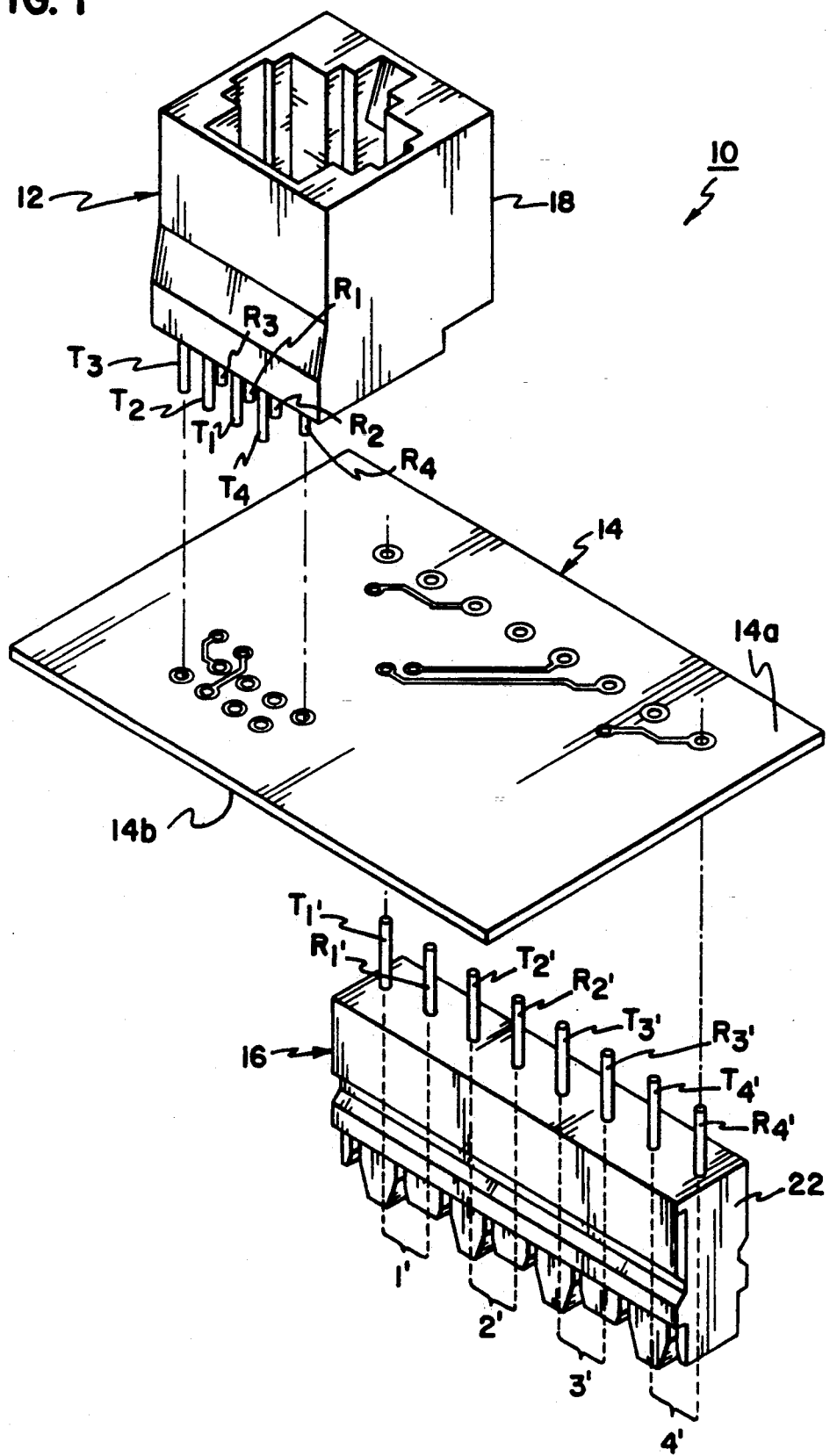
FIG. 1 is an exploded perspective view of a patch panel according to the present invention.

Referring now to the several drawing figures in which identical elements are numbered or labeled identically throughout, a description of the preferred embodiment of the present invention will now be provided.

In a Category 5 patch panel, an RJ-45 jack and a connector block are secured to a printed circuit board. Such a patch panel is shown generally at 10 in the drawings. The patch panel includes a RJ-45 jack 12, a printed circuit board 14 and a connector block 16.

Those skilled in the art will readily recognize that an RJ-45 is a well known product conforming with industry standards as set forth in FCC 68 Subpart F. The jack 12 includes a dielectric housing 18 containing a plurality of jack springs disposed in generally parallel side-by-side relation.

In an RJ-45 jack 12, there are eight such jack springs comprising four pairs of tip and ring jack springs. Shown schematically in FIGS. 2 and 3, the plurality of jack springs include a first tip jack spring $S_{T1}$, a first ring jack spring $S_{R1}$, a second tip jack spring $S_{T2}$, a second ring spring $S_{R2}$, a third tip spring $S_{T3}$, a third ring spring $S_{R3}$, a fourth tip spring $S_{T4}$, and a fourth ring spring $S_{R4}$. Springs $S_{T1}$, $S_{R1}$ comprise a first pair 1, springs $S_{T2}$, $S_{R2}$ comprise a second spring pair 2, springs $S_{T3}$, $S_{R3}$ comprise a third spring pair 3 and springs $S_{T4}$, $S_{R4}$ comprise a fourth pair 4 of jack springs.

Figure 2:
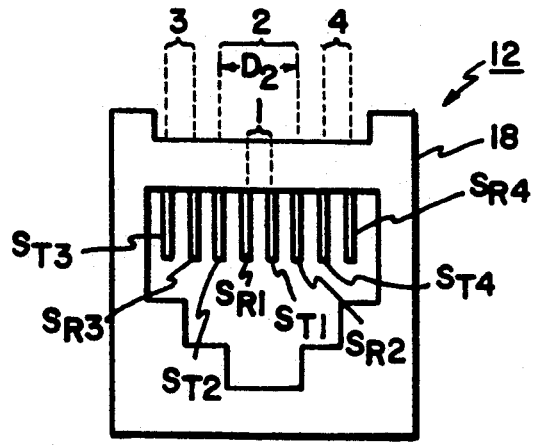
FIG. 2 is a front elevation view of a first embodiment of an RJ-45 jack for use of the present invention.
Figure 3:
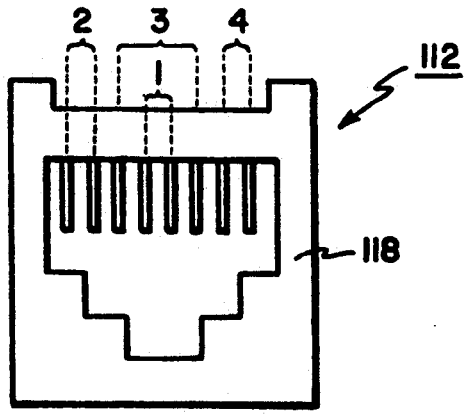
FIG. 3 is an alternative embodiment of the jack of FIG. 2 showing a different labeling sequence for pairs of springs within the jack.

FIG. 2 shows a so-called T568A arrangement with an RJ-45 jack 12 with pair 1 centrally positioned. Pair 2 straddles pair 1. Pairs 3 and 4 are positioned on opposite sides of pair 2. FIG. 3 shows a so-called T568B RJ-45 jack 112 arranged with pair 3 straddling pair 1 and with pairs 2 and 4 on the sides. Jacks 12,112 are identical. The labeling of pairs is different. Accordingly, the present invention applies to both. For ease of description, the pairing nomenclature of FIG. 2 will be utilized in this application.

Each of the jack springs $S_{T1}$-$S_{T4}$ and $R_{T1}$-$R_{T4}$ have predetermined lengths and each terminates at contact points $T_1$-$T_4$, $R_1$-$R_4$ (FIG. 1) disposed on an exterior of the jack housing 18 in a predetermined first array. As shown in the drawings, the array includes two staggered lines with the first line comprising contact points $R_1$-$R_4$ for the ring springs and the second line comprising contact points $T_1$-$T_4$ for the tip springs. For ease of illustration, the contact points are labeled $R_1$-$R_4$ to correspond with the ring springs $S_{R1}$-$S_{R4}$, respectively. The contact points for the tip springs are labeled $T_1$-$T_4$ to correspond with tip springs $S_{T1}$-$S_{T4}$, respectively.

The connector block 16 includes a dielectric housing 22 which contains a plurality of insulation displacement connectors including first through fourth tip connectors $T_1'$-$T_4'$ and ring connectors $R_1'$-$R_4'$ disposed in a linear array with the tip and ring connectors disposed in side-by-side sequence, arranged in pairs 1', 2', 3', 4' as best shown in FIG. 1.

Figure 5:
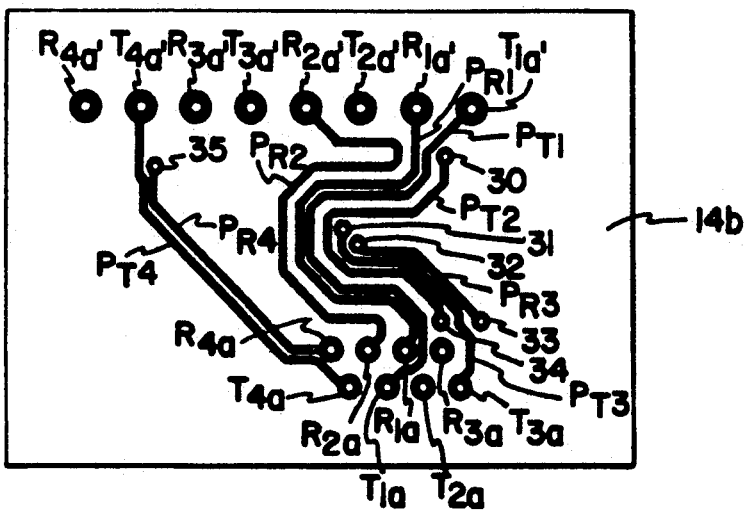
FIG. 5 is plan view of an opposite surface of the printed circuit board of the present invention.
Figure 4:
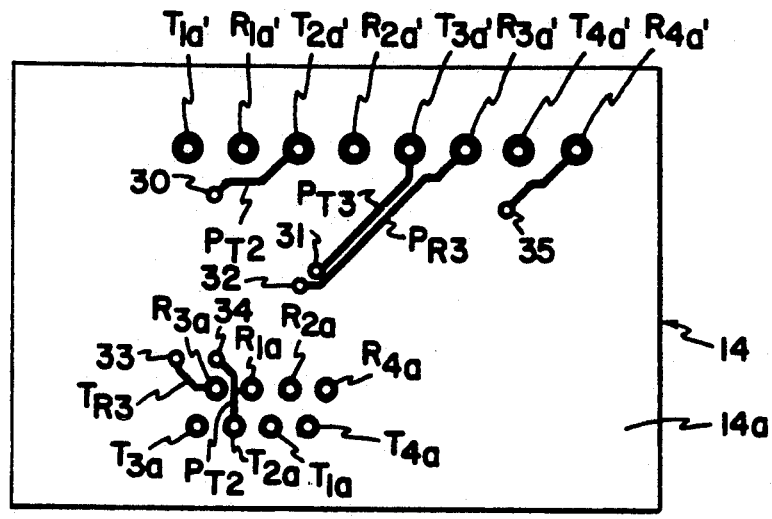
FIG. 4 is a plan view of one surface of the printed circuit board of the present invention.
Figure 5A:
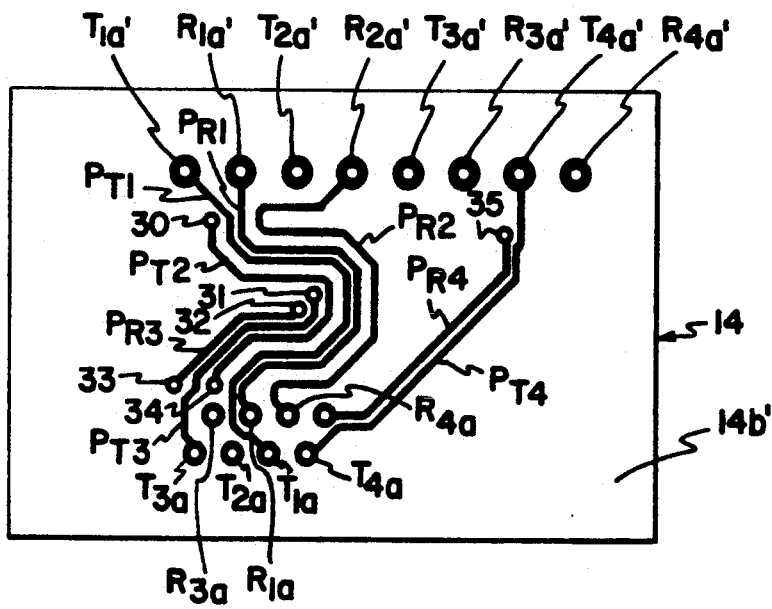
FIG. 5A is a mirror image of FIG. 5 showing circuit paths as if viewed through the circuit board surface shown in FIG. 4.

The printed circuit board 14 is a two layer board having circuit paths formed on first and second sides 14a, 14b of the board. In FIG. 4, surface 14a is shown. In FIG. 5, surface 14b is shown. FIG. 5A shows a surface 14b' which is a mirror image of surface 14b. Surface 14b' shows the circuit pathways on the printed circuit board as if they could be viewed through surface 14a. It is believed a comparison of FIGS. 4 and FIGS. 5A provide a better understanding of the completed circuit paths on the printed circuit board.

The printed circuit board 14 includes a plurality of contact locations for receiving the contact points of the RJ-45 jack 14 and the connector block 16. The plurality of contact points includes a first array of contact locations $T_{1a}-T_{4a}$ and $R_{1a}-R_{4a}$ disposed in an array to receive the contact points $T_1-T_4$ and $R_1-R_4$ of the RJ-45 jack 12. The plurality of contact locations on the printed circuit board also include a second array of contact locations $T_{1a}'-T_{4a}'$ and $R_{1a}'-R_{4a}'$ disposed in an array to receive the exposed contact $T_1'-T_4'$, $R_1'-R_4'$, respectively, of the connector block 16. In a preferred embodiment, the connector block, is such as sold by AT&T under the name 110 Block.

Also contained on the printed circuit board 14 are a plurality of electrically conductive paths $P_{T1}-P_{T4}$ and $P_{R1}-P_{R4}$. The plurality of paths includes a first tip path $P_{T1}$ connecting contact locations $T_{1a}$ and $T_{1a}'$. A second electrically conductive path $P_{T2}$ connects locations $T_{2a}$ and $T_{2a}'$. Similarly, paths $P_{T3}$, $P_{T4}$, $P_{R1}$, $P_{R2}$, $P_{R3}$ and $P_{R4}$ connect contact location pairs $T_{3a}$, $T_{3a}'$; $T_{4a}$, $T_{4a}'$; $R_{1a}$, $R_{1a}'$, $R_{2a}$, $R_{2a}'$; $R_{3a}$, $R_{3a}'$ and $R_{4a}$, $R_{4a}'$, respectively. As shown in the drawings, pathways $P_{T1}$, $P_{R1}$, $P_{R2}$, $P_{T4}$ all are contained on one side 146 of the board 14. Paths $P_{R3}$, $P_{T2}$, $P_{T3}$, and $P_{R4}$ include portions existing on both sides 14a,14b of the printed circuit board 14 with the portions carried through the board by pass through locations 30-35 to effect crossing of various pathways as will be described.

In order to block and prevent magnetic fields resulting from transmissions of signals along a line from interfering with signals on adjacent lines, the various pathways are crossed in a novel manner.

The pathways $P_{T1}-P_{T4}$ and $P_{R1}-P_{R4}$ are electrically connected to the springs $S_{T1}-S_{T4}$ and $S_{R1}-S_{R4}$, respectively. The paths and the springs cooperate to define complete circuit paths for the various tip and ring circuits of pairs 1-4.

Figure 6:
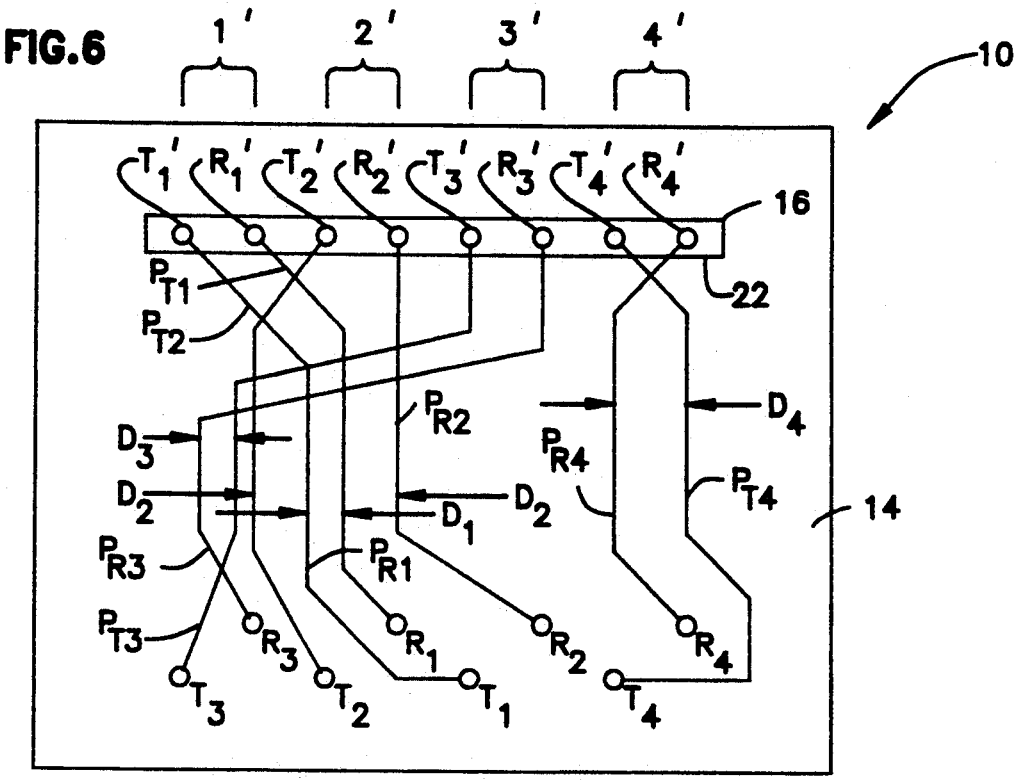
FIG. 6 is a schematic representation of the present invention showing circuit paths on the printed circuit board.

As shown best in FIG. 6, the pathways from the springs $S_{T1}-S_{T4}$ and $S_{R1}-S_{R4}$ cross one another in a crossing pattern from the springs to the connectors $T_1'-T_4'$ and $R_1'-R_4'$. The springs of the jack reside in jack 12 in the following side-by-side sequence: $S_{T3}$, $S_{R3}$, $S_{T2}$, $S_{R1}$, $S_{T1}$, $S_{R2}$, $S_{T4}$, $S_{R4}$. This sequence is reversed partially modifiedon board 14 in a unique geometry which permits the patch panel 10 to meet Category 5 standards.

With initial reference to pair 1, the reader will note that within the jack 12, spring $S_{R1}$ is to the immediate left of spring $S_{T1}$. However, on the circuit board (FIG. 6), the pathway $P_{T1}$ is on the left of pathway $P_{R1}$. Accordingly, the tip and ring circuits for path 1, cross one another once from the springs $S_{T1}$, $S_{R1}$ to connectors $T_1'$, $R_1'$.

Figure 7:
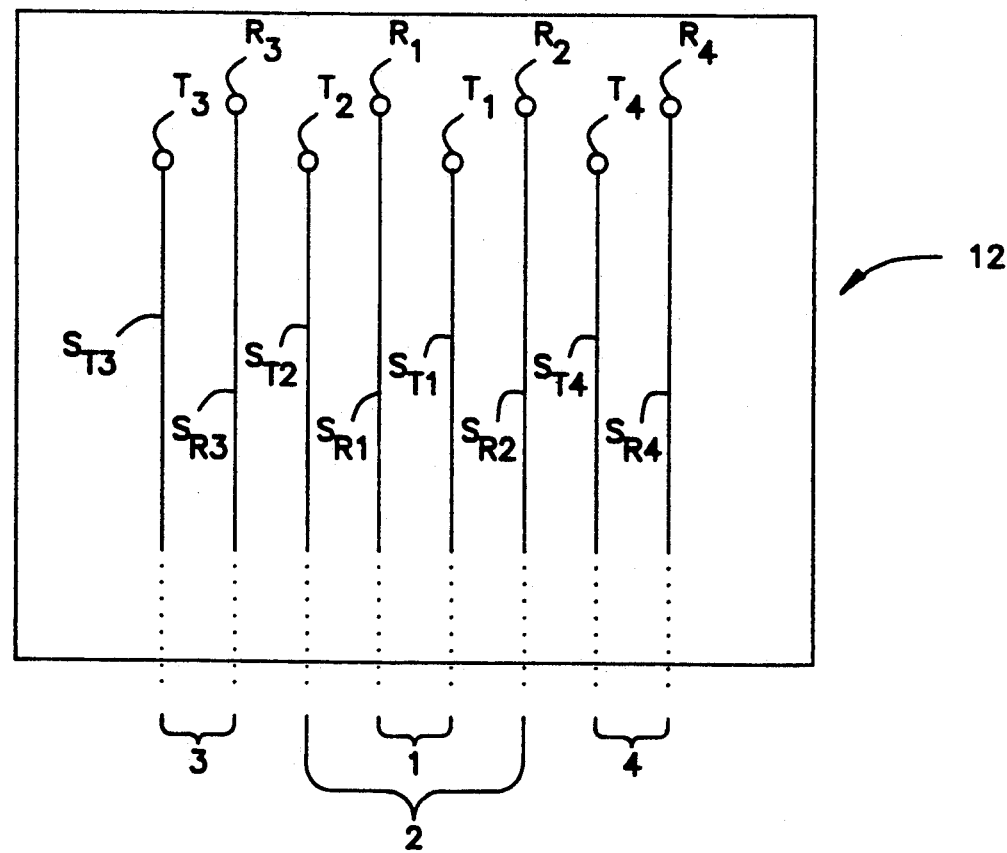
FIG. 7 is a schematic representation of an RJ-45 jack for use in the present invention.

With reference to FIGS. 2, 7, the reader will note that within the jack 12, second tip spring $S_{T2}$ is to the immediate left of first ring spring $S_{R1}$ and the second ring spring $S_{R2}$ is to the immediate right of the first tip spring $S_{T1}$. With reference to the schematic of FIG. 6, the reader will note that the pathways $P_{T2}$ and $P_{R2}$ are positioned such that $P_{T2}$ remains to the left of pathway $P_{R2}$. As a result, the tip and ring circuit paths of pair 2 do not cross from the jack 12 to the connector 16. However, due to the crossing of the tip and ring paths of springs $S_{R1}$, $S_{T1}$ (as previously described) the tip and ring conductors of the second pair 2 cross relative to the conductors of the first pair 1.

With reference now to pair 3, the reader will note that within the jack, the springs $S_{T3}$ is to the immediate left of spring $S_{R3}$. In the schematic of FIG. 6, the reader will note that pathways $P_{R3}$, $P_{T3}$, cross twice from the jack 12 to the connection block 16.

With respect to the circuit paths of pair 4, in the jack 12, the spring $S_{T4}$ is to the immediate left of the spring $S_{R4}$. The circuit path $P_{T4}$ is selected such that it passes to the right of path $P_{R4}$ from near points $T_4,R_4$. Furthermore, the paths $P_{R4}$, $P_{T4}$ cross in close proximity to the connectors $T_4'$, $R_4'$. As a result, in the circuit path from springs $S_{T4}$, $S_{R4}$ to $T_4'$, $R_4'$, the circuit paths $P_{T4}$,$P_{R4}$ cross one another twice.

From the foregoing description, the reader will note that the tip and ring circuit paths of pair 2 do not cross. The tip and ring circuit paths of pair 1 cross once over themselves and, hence, cross relative to the circuit paths of pair 2. Circuit paths 3,4, cross twice over themselves, and, hence, cross relative to all other circuit paths on the printed circuit board 14.

Applicants have found that the foregoing crossing helps achieve the transmission standard set by Category 5. The reader will note that pathway $P_{T2}$ crosses pathways $P_{T1}$ and $P_{R1}$ on the circuit board. In order to avoid coupling between pathway $P_{T2}$ and pathways $P_{T1}$, $P_{R1}$, the pathway $P_{T2}$ crosses pathways $P_{T1}$, $P_{R1}$ at approximately a perpendicular angle. Similarly, pathways $P_{R3}$, $P_{T3}$ cross pathways $P_{T2}$, $P_{T1}$, $P_{R1}$, $P_{R2}$ at approximately 90 degree angles to prevent coupling with the circuits they are crossing.

In addition to the crossing geometry, the Applicants have found that dimensions and spacings of the various pathways $P_{T1}-P_{T4}$ and $P_{T1}-P_{R4}$ are desirable.

With reference to FIGS. 4,5,5A, the reader will note that the pathways of a pair (for example, $P_{R1}$, $P_{R2}$) are maintained in generally parallel alignment substantially throughout their length. Also, spacing between pathways of a pair (for example, the spacing between pathways $P_{R1}$, $P_{R2}$) is held to be substantially constant throughout their length.

Applicants have found that the stringent requirements of Category 5 can be attained by selecting the lengths of the pathways $P_{T1}-P_{T4}$ and $P_{R1}-P_{R4}$ such that the lengths of the pathways to $P_{T1}-P_{T4}$ and $P_{R1}-P_{R4}$ are substantially equal to or greater than the lengths of their associated springs $S_{T1}-S_{T4}$ and $S_{R1}-S_{R4}$ respectively. Also, Applicants have found that the spacing between paired pathways assists in achieving the stringent performance requirements of Category 5. Specifically, the distance $D_4$ between pathways $P_{R4}$, $P_{T4}$ is selected such that a resistance between the pathways $P_{R4}$, $P_{T4}$ is about 100 ohms. Similarly, the distance $D_3$ between pathways $P_{R3}$, $P_{T3}$ is also selected such that a resistance between the pathways $P_{T3}$, $P_{R3}$ is about 100 ohms. Likewise, the distance $D_1$ between pathways $P_{T1}$, $P_{41}$ is also selected such that the resistance between the pathways $P_{T1}$, $P_{R1}$ is about 100 ohms.

The distance $D_2$ between pathways $P_{T2}$, $P_{R2}$ is selected differently. With reference to FIG. 2, the reader will note that within jack 12, the springs $S_{T2}$, $S_{R2}$ are spaced apart by a predetermined distance $D_2$. In an RJ-45 jack 12, this distance is about 0.120 inches between the centerline of the springs $S_{T2}$, $S_{R2}$. The distance $D_2$ is maintained such that the distance between the centerline of the pathways $P_{T2}$, $P_{R2}$ on circuit board 14 is also 0.120 inches.

While the physics of the foregoing arrangement is not fully understood, Applicants have found that a patch panel made according to these teachings achieves the stringent and elusive performance requirements of Category 5. From the foregoing, the reader will note that the circuit paths of pair 2 do not cross. The circuit paths of pair 1 cross themselves once and, hence, cross relative to the circuit paths of pair 2. This could be reversed. Namely, the circuit paths of pair 1 could be non-crossing and the circuit paths of pair 2 could cross over themselves and relative to the circuit paths of pair 1.

From the foregoing detailed description of the present invention, it has been shown how the objects of the invention have been achieved in a preferred manner. However, modifications and equivalents of the disclosed concepts, such as those which readily occur to one skilled in that art, are intended to be included within the scope of the claims.

What is claimed is:

1. A connector panel for transmitting telecommunication signals, said panel comprising:
   (a) a jack having a dielectric housing, a plurality of jack springs contained within said housing and including at least a first, second, third and fourth pairs of tip and ring springs disposed in generally parallel side-by-side alignment and terminating at first through fourth tip and ring jack spring contact points disposed exterior of said housing;
   (b) a connector block having at least a first, second, third and fourth pairs of tip and ring connectors terminating at first through fourth tip and ring connector contact points;
   (c) a printed circuit board
      (i) having a first array of at least eight contact locations aligned to receive individual ones of said jack spring contact points, said first array including first through fourth pairs of tip and ring contact locations electrically connected to said first through fourth tip and ring jack spring contact points, respectively;
      (ii) a second array of contact locations aligned to receive individual ones of said exposed connector contact points, said second array including first through fourth pairs of tip and ring contact location electrically connected to said first through fourth tip and ring jack spring contact points, respectively;
      (iii) at least eight electrical paths formed on said printed circuit board and including:
         (A) a first tip path connecting said first tip contact locations of said first and second arrays and cooperating with said first tip spring to define a first tip circuit path;
         (B) a first ring path connecting said first ring contact locations of said first and second arrays and cooperating with said first ring spring to define a first ring circuit path, said first tip and ring circuit paths comprising a first pair of paths;
         (C) a second tip path connecting said second tip contact locations of said first and second arrays and cooperating with said second tip spring to define a second tip circuit path;
         (D) a second ring path connecting said second ring contact locations of said first and second arrays and cooperating with said second ring spring to define a second ring circuit path, said second tip and ring circuit paths comprising a second pair of paths;
         (E) a third tip path connecting said third tip contact locations of said first and second arrays and cooperating with said third tip spring to define a third tip circuit path;
         (F) a third ring path connecting said third ring contact locations of said first and second arrays and cooperating with said third ring spring to define a third ring circuit path, said third tip and ring circuit paths comprising a third pair of paths;
         (G) a fourth tip path contacting said fourth tip contact locations of said first and second arrays and cooperating with said fourth tip spring to define a fourth tip circuit path;
         (H) a fourth ring path connecting said fourth ring contact locations of said first and second arrays and cooperating with said fourth ring spring to define a fourth ring circuit path, said fourth tip and ring circuit paths comprising a fourth pair of paths;
      (iv) said first through fourth tip paths, said first through fourth ring paths and said springs mutually disposed for said tip and ring circuit paths of at least one of said first and second pairs to crossover and to cross relative to tip and ring circuit paths of the other of said first and second pairs;
      (v) said third tip circuit path and said third ring circuit path disposed to cross over one another;
      (vi) said fourth tip circuit path and said fourth ring circuit path disposed to cross over one another.

2. A panel according to claim 1 wherein said second tip spring and said second ring spring are disposed within said housing and spaced apart by a predetermined spacing;
   said second tip path and said second ring path disposed on said printed circuit board spaced apart by a distance approximate to said predetermined spacing substantially along a length of said second tip and ring paths.

3. A panel according to claim 1 wherein said first tip path has a length approximating a length of said first tip spring;
   said first ring path has a length approximating a length of said first ring spring;
   said second tip path has a length not substantially less than a length of said second tip spring;
   said second ring path has a length not substantially less than a length of said second ring spring;
   said third tip path has a length not substantially less than a length of said third tip spring;
   said third ring path has a length not substantially less than a length of said third ring spring;
   said fourth tip path has a length not substantially less than a length of said fourth tip spring;
   said fourth ring path has a length not substantially less than a length of said fourth ring spring.

4. A panel according to claim 1 wherein said first tip and ring paths are spaced apart by a distance selected for a resistance between said paths to approximate 100 ohms.

5. A panel according to claim 1 wherein said third tip and ring paths are spaced apart by a spacing selected for about a 100 ohms resistance.

6. A panel according to claim 1 wherein said fourth tip and ring paths are spaced apart by a spacing selected for about 100 ohms resistance between said fourth tip and ring paths.

7. A panel according to claim 1 wherein said at least one circuit paths are said circuit paths of said first pair.

8. A panel according to claim 7 wherein said circuit paths of said second pair do not cross over.

9. A panel according to claim 1 wherein said jack is an RJ-45 jack.

10. A panel according to claim 9 wherein said jack springs are disposed in the following predetermined side-by-side sequence: a third tip spring, a third ring spring, a second tip spring, a first ring spring, a first tip spring, a second ring spring, a fourth tip spring and a fourth ring spring.

* * * * *